US008432174B2

(12) United States Patent
Liu et al.

(10) Patent No.: US 8,432,174 B2
(45) Date of Patent: Apr. 30, 2013

(54) INTERROGATION CIRCUIT FOR A NANOWIRE SENSOR ARRAY AND A METHOD FOR INTERROGATING A NANOWIRE SENSOR ARRAY

(75) Inventors: Hai Qi Liu, Singapore (SG); Tee Hui Teo, Singapore (SG)

(73) Assignee: Agency for Science, Technology and Research, Connexis (SG)

( * ) Notice: Subject to any disclaimer, the term of this patent is extended or adjusted under 35 U.S.C. 154(b) by 384 days.

(21) Appl. No.: 12/734,199

(22) PCT Filed: Nov. 15, 2007

(86) PCT No.: PCT/SG2007/000395

§ 371 (c)(1), (2), (4) Date: Jul. 22, 2010

(87) PCT Pub. No.: WO2009/064256

PCT Pub. Date: May 22, 2009

(65) Prior Publication Data

US 2010/0295580 A1 Nov. 25, 2010

(51) Int. Cl.
*G01R 27/08* (2006.01)

(52) U.S. Cl.
USPC ........... 324/691; 324/701; 324/707; 324/711; 324/712

(58) Field of Classification Search .................. 324/691, 324/707, 710, 711, 712
See application file for complete search history.

(56) References Cited

U.S. PATENT DOCUMENTS

| | | | | |
|---|---|---|---|---|
| 7,257,439 | B2 | 5/1990 | Mochizuki et al. | 917/2 |
| 5,747,805 | A * | 5/1998 | Youngquist | 250/338.4 |
| 5,793,230 | A | 8/1998 | Chu et al. | 327/77 |
| 6,326,859 | B1 * | 12/2001 | Goldman et al. | 331/143 |
| 7,301,352 | B1 * | 11/2007 | Sarma | 324/691 |
| 2004/0047099 | A1 * | 3/2004 | Pippin | 361/103 |

(Continued)

FOREIGN PATENT DOCUMENTS

WO WO 2006/105478 10/2006

OTHER PUBLICATIONS

Liu et al., "Design and frequency/phase-noise analysis of a GHz CMOS ring oscillator with coarse and fine frequency tuning," Analog Integrated Circuits and Signal Processing 48(2):85-94 (2006).

(Continued)

*Primary Examiner* — Richard Isla Rodas
*Assistant Examiner* — Adam Clarke
(74) *Attorney, Agent, or Firm* — K&L Gates, LLP

(57) ABSTRACT

An interrogation circuit for a nanowire sensor array and a method for interrogating a nanowire sensor array are provided. The circuit comprises a switch array connected to the nanowire sensor array for selectively connecting first ends of nanowire sensors of the nanowire sensor array to a reference voltage; an integration amplifier (IA) connected to second ends of the nanowire sensors at a first input of the IA and to the reference voltage at a second input of the IA, for generating an oscillating output signal clamped between first and second voltage values; wherein the switch array is further arranged for switching one of the nanowire sensors to be connected in a closed loop with the IA such that a current through said one nanowire sensor periodically charges and discharges an integration capacitor of the IA for determining a resistance of said one nanowire sensor from a frequency of the periodic charging and discharging.

18 Claims, 8 Drawing Sheets

U.S. PATENT DOCUMENTS

| | | | | |
|---|---|---|---|---|
| 2004/0204915 | A1 | 10/2004 | Steinthal et al. | 702/32 |
| 2005/0006234 | A1 * | 1/2005 | Hassibi | 204/403.01 |
| 2005/0230271 | A1 * | 10/2005 | Levon et al. | 205/789 |
| 2007/0099351 | A1 * | 5/2007 | Peters et al. | 438/142 |
| 2007/0273451 | A1 * | 11/2007 | Osvaldella | 331/57 |
| 2008/0035494 | A1 * | 2/2008 | Gomez et al. | 205/792 |

OTHER PUBLICATIONS

Liu et al., "A 7-GHz multiloop ring oscillator in 0.18-μm CMOS technology," Analog Integrated Circuits and Signal Processing 56(3):179-184 (2008).

Liu et al., "A Low-Power Widc-Range Interface Circuit for Nanowire Sensor Array Based on Resistance-to-Frequency Conversion Technique," 12th International Symposium on Integrated Circuits, Suntec Singapore International Convention & Exhibition Centre, Dec. 14-16, 2009.

Amirtharajah et al., "Circuit Interfaces and Optimisation for Resistive Nanosensors" in Proc. Of SPIE vol. 6008—Nanosensing: Materials and Devices II, Eds., Islam and Dutta (2005).

Flammini et al., "A low-cost interface to high value resistive sensors varying over a wide range IEEE Transactions on Instrumentation Measurement," 53(4):1052-1056 (2004).

Grassi et al "A 160 dB equivalent dynamic range auto-scaling interface for restrictive gas sensors arrays, IEEE Journal of Solid-State Circuits," 42(3):518-528 (2007).

Gray et al., "Analysis and design of analog integrated circuits," 4$^{th}$ Edition, John Wiley & Sons, Inc., 450-453 (2001).

Llinas et al., "Brain-machine interface via neurovascular approach," In: Converging Technologies for Improving Human performance: Nanotechnology, Biotechnology, Information Technology and Cognitive Science. Eds., Roco, Mihail, Sims, 244-251 (2004).

Warneke, B., "Ultra-low energy architectures and circuits for cubic millimeter distributed wireless sensor networks," Ph.D. Dissertation Univ of Cal Berkeley (2003).

Wobschall et al., "Circuit design for electronic instrumentation: Analog and Digital Devices from Sensor to Display" The McGraw Hill Book Company, 2nd Edition, 216-220 (1987).

International Search Report, issued Feb. 8, 2008, in connection with corresponding International Patent Application No. PCT/SG2007/000395.

Written Opinion of the International Searching Authority, issued Feb. 8, 2008, in connection with corresponding International Patent Application No. PCT/SG2007/000395.

International Preliminary Report on Patentability, issued May 18, 2010, in connection with corresponding International Patent Application No. PCT/SG2007/000395.

* cited by examiner

600

INTERROGATION CIRCUIT FOR A NANOWIRE SENSOR ARRAY AND A METHOD FOR INTERROGATING A NANOWIRE SENSOR ARRAY

FIELD OF INVENTION

The present invention relates broadly to an interrogation circuit for a nanowire sensor array and to a method for interrogating a nanowire sensor array.

BACKGROUND

Interface circuitry for nanowire based sensors is typically important for reading out conductance changes that occur in the nanowires when detecting the density or reaction between macromolecules such as Deoxyribonucleic acid (DNA) or protein. Typically, the design of interface circuits with low noise, large dynamic range and high sensitivity to small changes in the conductance of nanowires is practically challenging.

A typical nanowire sensor behaves electrically as a resistor. Its resistance value comprises of three components ie. a baseline resistance $R_{BL}$, which can vary from a few MΩ to a few GΩ depending on fabrication conditions such as the doping density, a deviation $\Delta R_{BL}$ from the baseline resistance $R_{BL}$, which is caused by temperature variation, and a resistance variation ΔR due to bonding of charged macromolecules to nanowire receptors. Hence, the nanowire sensor impedance can be written as $R_{nw}=R_{BL}+\Delta R_{BL}+\Delta R$. The resistance variation ΔR is measured when the nanowire sensor is exposed to a solution containing a specific biomolecule. The resistance $R_{nw}$ can typically increase or decrease by as small as about 1% of the baseline value $R_{BL}$ depending on the net charge of the macromolecule (ie. the biomolecule) and the semiconductor type (ie. p- or n-type) of the sensor. The typical large variation of the baseline impedance $R_{BL}$, combined with the typical small variation ΔR to be measured, thus necessitates a high precision detection requirement for an electrical read-out interface circuit, in order to provide an adequate margin for a subsequent data processing block, such as a microcontroller, to recognize the macromolecule contained in the solution and the concentration of the marcomolecule.

M. Grassi, P. Malcovati, and A. Baschirotto in "A 160 dB equivalent dynamic range auto-scaling interface for resistive gas sensors arrays," *IEEE Journal of Solid-State Circuits*, vol. 42, no. 3, pp. 518-528, March 2007, describe an integrated wide dynamic-range interface circuit for gas sensors that achieves an accuracy of about 0.1% over a sensor resistance range of more than 5 decades. However, the accuracy is at a cost of using a practically sophisticated calibration system, an increased die area and increased realization costs.

A. Flammini, D. Marioli, and A. Taroni in "A low-cost interface to high value resistive sensors varying over a wide range," *IEEE Transactions on Instrumentation Measurement*, vol. 53, no. 4, pp. 1052-1056, August 2004, describe a low-cost interface which is implemented by using a similar approach to M. Grassi et al for high-value resistive sensors. However, the work of A. Flammini et al is not an integrated circuit and is undesirably sensitive to parasitic capacitances. Thus, there is a problem of a large parasitic capacitance affecting sensing accuracy.

Hence, there exists a need for an interrogation circuit for a nanowire sensor array and a method for interrogating a nanowire sensor array which seek to address at least one of the above problems.

SUMMARY

In accordance with an aspect of the present invention, there is provided an interrogation circuit for a nanowire sensor array, the circuit comprising a switch array connected to the nanowire sensor array for selectively connecting first ends of nanowire sensors of the nanowire sensor array to a reference voltage; an integration amplifier (IA) connected to second ends of the nanowire sensors at a first input of the IA and to the reference voltage at a second input of the IA, for generating an oscillating output signal clamped between first and second voltage values; wherein the switch array is further arranged for switching one of the nanowire sensors to be connected in a closed loop with the IA such that a current through said one nanowire sensor periodically charges and discharges an integration capacitor of the IA for determining a resistance of said one nanowire sensor from a frequency of the periodic charging and discharging.

The circuit may further comprise a comparator connected to an output of the IA at a first input of the comparator and to the reference voltage at a second input of the comparator, the comparator having an internal hysteresis for generating the oscillating output signal clamped between first and second voltage values at an output of the comparator; and a clocked flipflop connected to an output of the comparator at a first input of the flipflop and to a clock signal at a second input of the flipflop for measuring the frequency of the periodic charging and discharging.

The circuit may further comprise a digitally-controlled ring oscillator (DCO) for generating the clock signal.

The DCO may comprise a programmable voltage-referenced inversion current source; a multi-stage ring oscillator circuit having a reduced-swing output; and a full swing restoration circuit.

The full swing restoration circuit may comprise a dummy oscillator circuit and a comparator circuit, the full swing restoration circuit being capable of restoration of a full-swing output with a duty-cycle of about 50%.

The switch array may be arranged for switching said one of the nanowire sensors to be connected in a closed loop with the IA and the flipflop.

The IA may comprise an opamp connected to the second ends of the nanowire sensors at a first input of the opamp functioning as the first input of the IA, and to the reference voltage at a second input of the opamp functioning as the second input of the IA.

The IA may be programmable.

The integration capacitor may comprise a capacitor array for selectively setting a capacitance of the integration capacitor.

In accordance with another aspect of the present invention, there is provided a method for interrogating a nanowire sensor array, the method comprising selectively connecting first ends of nanowire sensors of the nanowire sensor array to a reference voltage; connecting an integration amplifier (IA) to second ends of the nanowire sensors at a first input of the IA and to the reference voltage at a second input of the IA, for generating an oscillating output signal clamped between first and second voltage values; switching one of the nanowire sensors to be connected in a closed loop with the IA such that a current through said one nanowire sensor periodically charges and discharges an integration capacitor of the IA; and determining a resistance of said one nanowire sensor from a frequency of the periodic charging and discharging.

The method may further comprise connecting a comparator to an output of the IA at a first input of the comparator and to the reference voltage at a second input of the comparator, the comparator having an internal hysteresis for generating the oscillating output signal clamped between first and second voltage values at an output of the comparator; and connecting a clocked flipflop to an output of the comparator at a first input of the flipflop and to a clock signal at a second input of the flipflop for measuring the frequency of the periodic charging and discharging.

The method may further comprise generating the clock signal using a digitally-controlled ring oscillator (DCO).

The DCO may comprise a programmable voltage-referenced inversion current source; a multi-stage ring oscillator circuit having a reduced-swing output; and a full swing restoration circuit.

The full swing restoration circuit may comprise a dummy oscillator circuit and a comparator circuit, the full swing restoration circuit being capable of restoration of a full-swing output with a duty-cycle of about 50%.

The method may further comprise switching said one of the nanowire sensors to be connected in a closed loop with the IA and the flipflop.

The IA may comprise an opamp connected to the second ends of the nanowire sensors at a first input of the opamp functioning as the first input of the IA, and to the reference voltage at a second input of the opamp functioning as the second input of the IA.

The IA may be programmable.

The integration capacitor may comprise a capacitor array for selectively setting a capacitance of the integration capacitor.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
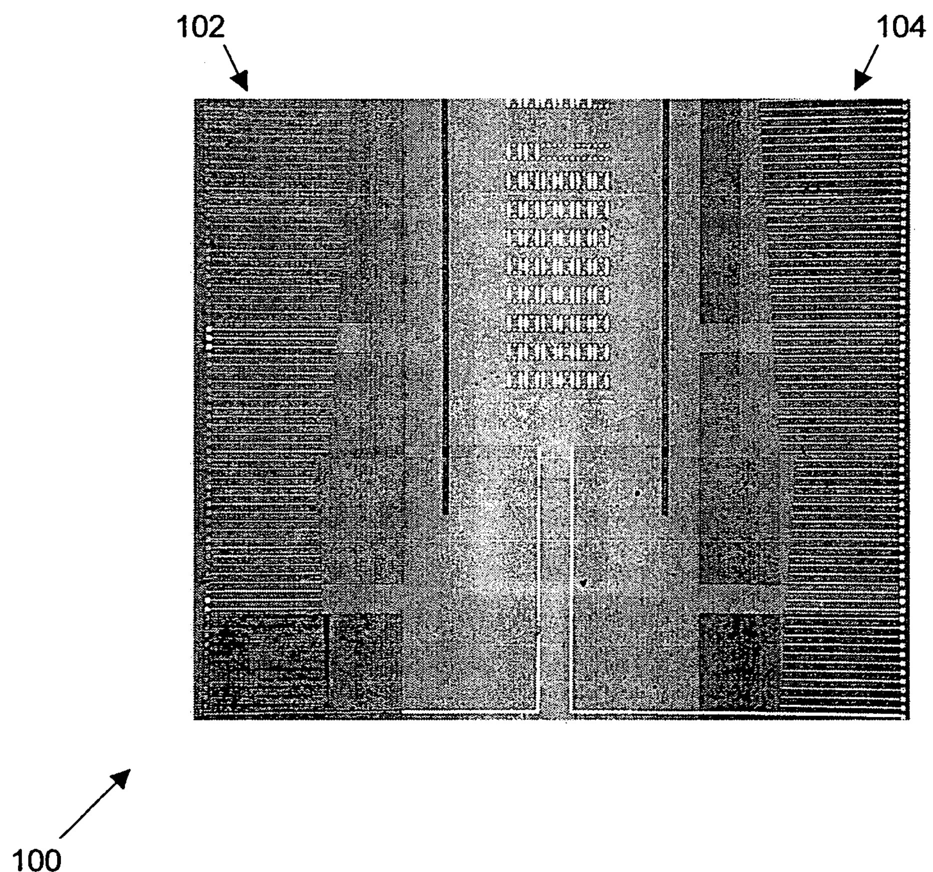
FIG. 1 is microphotograph showing a typical nanowire microarray sensor.
Figure 2:
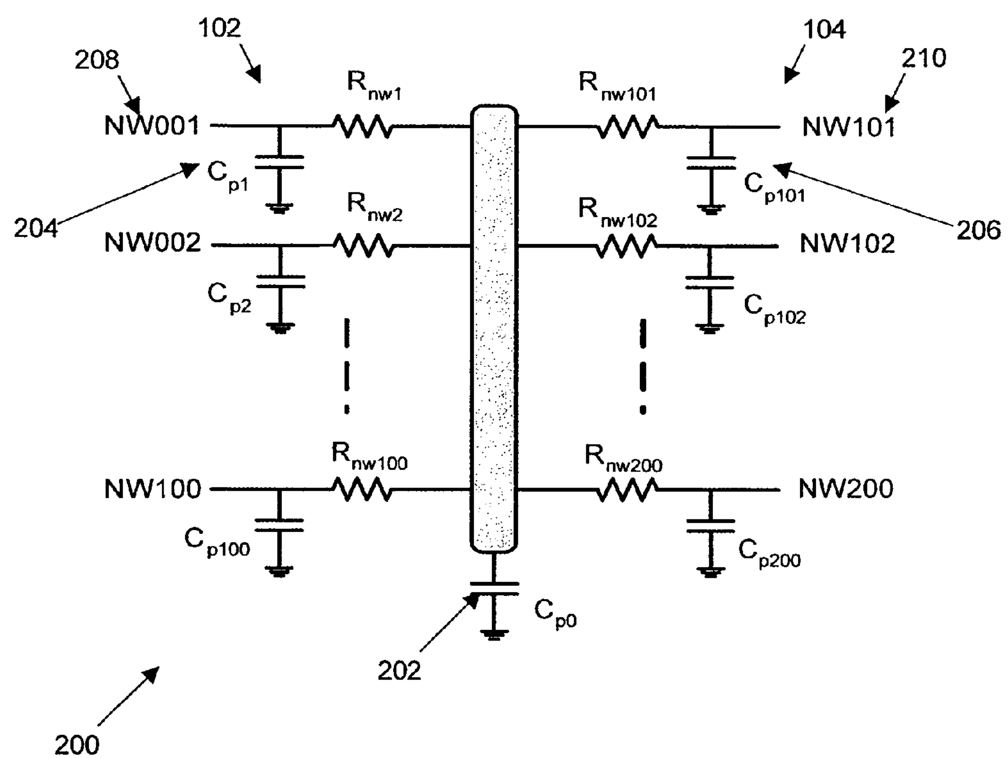
FIG. 2 is a schematic circuit model of the microarray sensor of FIG. 1.

FIG. 1 is microphotograph 100 showing a typical nanowire microarray sensor. There are two hundred nanowire sensors integrated on a chip, with one hundred sensors on each side 102, 104. Each nanowire sensor comprises a single nanowire connected for resistive measurements. The two hundred sensors share a common terminal. FIG. 2 is a schematic circuit model 200 of the microarray sensor of FIG. 1. All parasitic capacitors are included in the model 200, including a parasitic capacitor 202 contributed by the common terminal, $C_{p0}$, and parasitic capacitors e.g. 204, 206 contributed by the metal lines on the sides 102, 104 ie. $C_{pn}$ (n=1, 2. . . ). The parasitic capacitor 202 is the largest capacitor while the parasitic capacitors e.g. 204, 206 are much smaller than the parasitic capacitor 202. Since the nanowire sensors e.g. 208, 210 are connected to an external DC voltage through switches (not shown), the small parasitic capacitors e.g. 204, 206 typically do not have any effect on the performance of the microarray sensor of FIG. 1.

Figure 3:
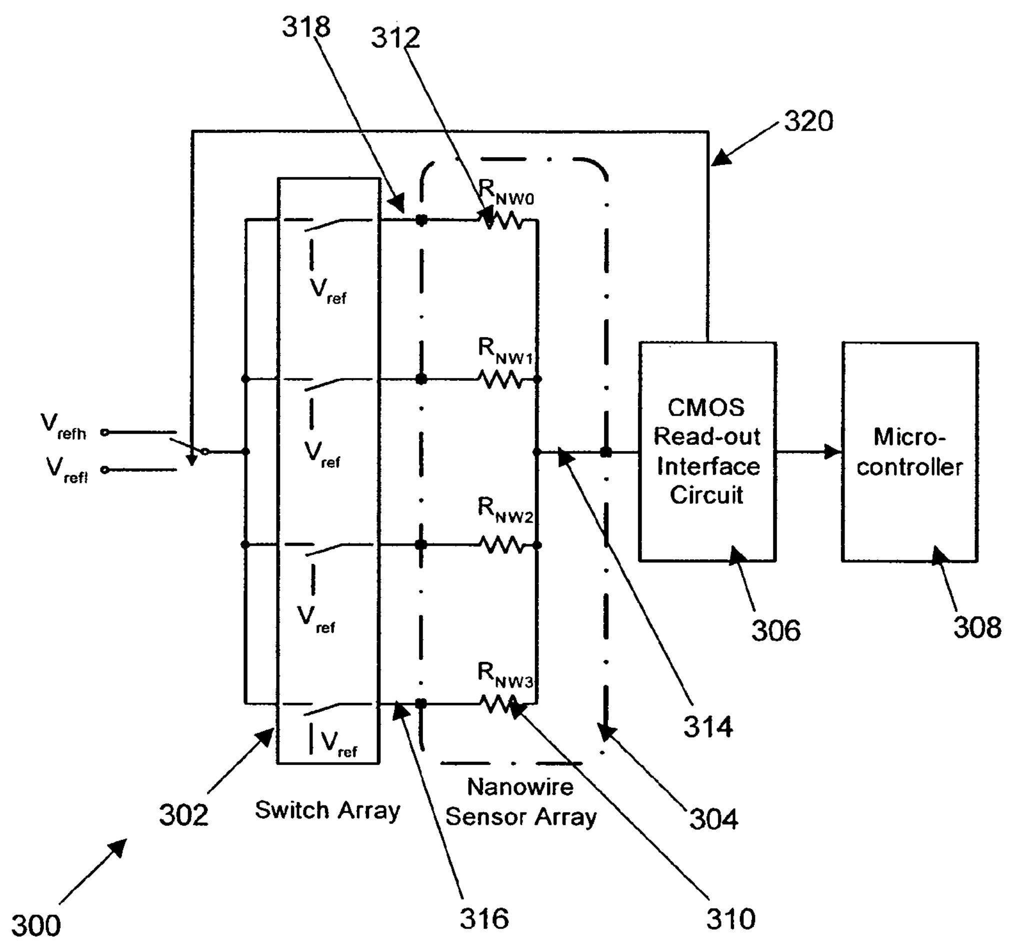
FIG. 3 is a schematic block diagram illustrating a nanowire sensor system in an example embodiment.

FIG. 3 is a schematic block diagram illustrating a nanowire sensor system 300 in an example embodiment. The nanowire sensor system 300 is of a four-channel type and comprises a switch array 302, a nanowire sensor array 304, an interrogation or read-out interface circuit 306 and a microcontroller 308. It is noted that the nanowire sensor parasitic capacitors are not shown in FIG. 3. The nanowire sensor array 304 comprises four sensors e.g. e.g. 310, 312. A common terminal 314 of the sensor array 304 is coupled to the read-out interface circuit 306 and connection ends e.g. 316, 318 of the four sensors e.g. 310, 312 to be measured are coupled to the switch array 302. The switch array 302 connects only one sensor into a loop 320 at any one time while the other three sensors are diverted to a fixed voltage $V_{ref}$. The nanowire sensor system 300 cycles through the sensors e.g. 310, 312 one at a time using a switching sequence. The switching sequence can be carried out by off-chip blocks such as a Field Programmable Gate Array (FPGA) unit or the microcontroller 308. In addition to the switching sequence, data gathering of the nanowire sensors in complete switching sequences can be implemented by a FPGA unit or the microcontroller 308. Further, it will be appreciated by a person skilled in the art that although four nanowire sensors are described in the example embodiment, the nanowire sensor system 300 is not limited to only four nanowire sensors and is applicable to a plurality of nanowire sensors.

Figure 4:
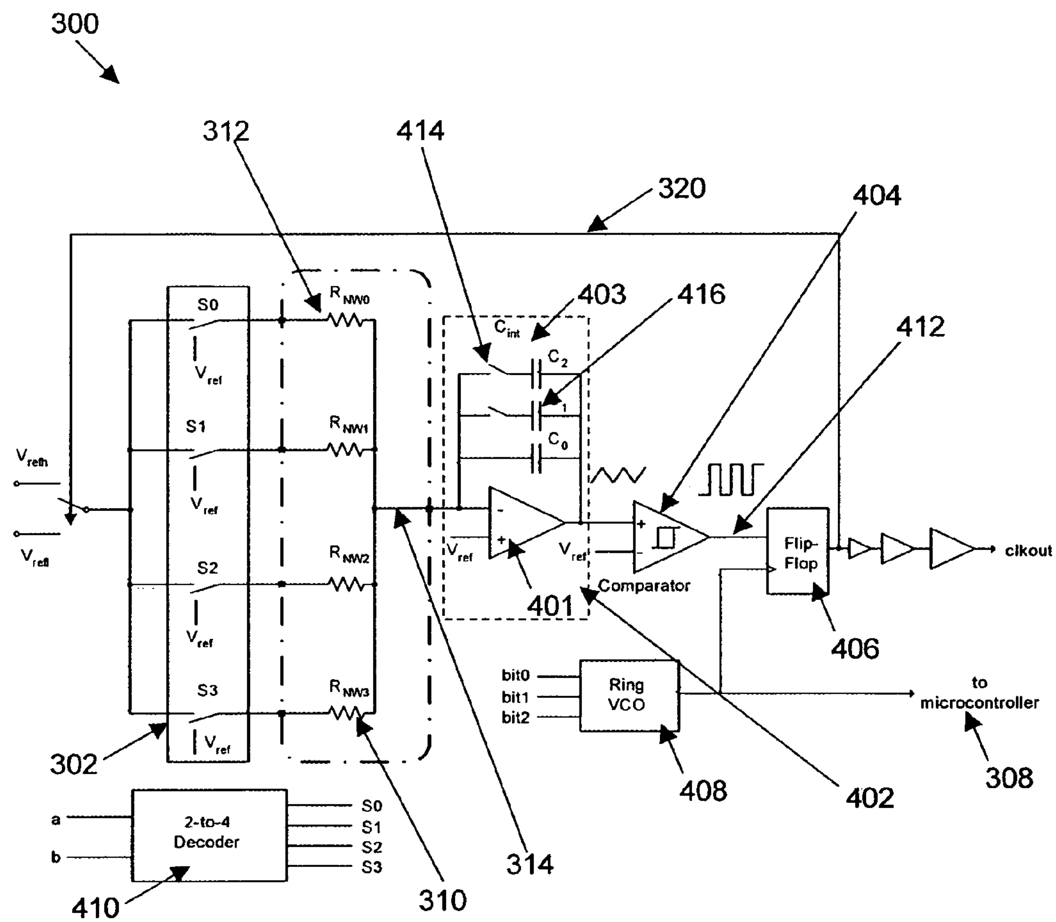
FIG. 4 is a schematic diagram illustrating the nanowire sensor system in more detail.

FIG. 4 is a schematic diagram illustrating the nanowire sensor system 300 in more detail. The read-out interface circuit 306 is shown in more detail. The read-out interface circuit 306 comprises a programmable integration amplifier (PIA) 402 comprising an opamp 401 and an integration capacitance $C_{int}$ 403 tunable across two decades. The PIA 402 is coupled to a comparator 404 with hysteresis. The read-out interface circuit 306 further comprises an oversampled flipflop 406 clocked by a three-bit digitally-controlled ring oscillator (DCO) 408. The DCO 408 is shown in the form of a ring voltage controlled oscillator (VCO) in FIG. 4. The DCO 408 output is used for sampling the comparator 404 output and also used to synchronise the microcontroller 308.

The switch array 302 is controlled by a 2-to-4 decoder 410. At any one time; there is only one nanowire sensor connected into the loop 320. The other three nanowire sensors are connected to the reference voltage $V_{ref}$. The positive input of the PIA 402 is connected to $V_{ref}$ and the common terminal 314 of all the sensors e.g. 310, 312 is connected to the negative input of the PIA 402. Thus, the connections have the effect of virtually shorting both ends of the other three nanowire sensors. One advantage of virtually shorting both ends of the other three sensors is that the leakage current introduced by the other three sensors is significantly reduced to minimize the impact on the measurement of the one sensor connected into the loop 320. Thus, advantageously, the significant parasitic capacitance contributed by the common terminal 314 does not have any effect on the sensing accuracy because of its connection to the virtual ground of the PIA 402.

In the example embodiment, the current flowing through the nanowire sensor connected into the loop 320 periodically charges and discharges the integration capacitor $C_{int}$ 403. Given that $V_{nw}=V_{refh}-V_{ref}=V_{ref}-V_{refl}$, the current can be described as $$I_{nw}=\frac{V_{nw}}{R_{nw}}. \tag{1}$$

As shown in FIG. 4, S0-S3 control which nanowire sensor e.g. 310, 312 is to be connected into the loop, e.g. if S0=1 and S1~S3=0, only nanowire sensor $R_{NW0}$ is connected to the flipflop 406 output, ie. functioning as a flipflop-controlled switch, while the other three nanowire sensors are connected to $V_{ref}$. The flipflop 406 output determines whether a high voltage. $V_{refh}$ or a low voltage $V_{refl}$ is connected to the connected nanowire sensor for discharging or charging of the integration capacitor $C_{int}$ 403.

Since the comparator 404 is built with internal hysteresis, the output of the PIA 402 is clamped within a hysteresis band $\{V_{THF}, V_{THR}\}$, where $V_{THR}$ is a trip point for rising input voltage and $V_{THF}$ represents a trip point for falling input voltage. Assuming that the hysteresis band value is $V_{TB}=V_{THR}-V_{THF}$, the output oscillation frequency at numeral 412 can be derived as $$f=\frac{1}{2\frac{V_{TB}\cdot C_{int}}{I_{nw}}}=\frac{I_{nw}}{2V_{TB}\cdot C_{int}}. \tag{2}$$

By replacing $I_{nw}$ with Eq. (1), a linear relationship between the resistive impedance $R_{nw}$ of the nanowire sensor connected into the loop 320 and the output clock frequency is found to be $$f=\frac{V_{nw}}{2V_{TB}\cdot C_{int}\cdot R_{nw}}. \tag{3}$$

The output clock frequency f is provided to the microcontroller (not shown in FIG. 4) for use by the microcontroller to determine frequency at any one stage of measurement.

The integration capacitor 403 comprises two switches e.g. 414 and three capacitors e.g. 416. The values of the capacitors e.g. 416 are C0, C1=9C0 and C2=90C0 so as to obtain three integration capacitances ie. C0, 10C0 and 100C0. By adopting this configuration, advantageously, the bandwidth requirement on the PIA 402 and the comparator 404 is significantly reduced. As an example, if a small nanowire sensor impedance is detected ie. resulting in a large output frequency according to Eq. (3), the microcontroller 308 chooses a larger integration capacitance to thereby reduce the frequency by one or two decades.

In the example embodiment, the PIA 402 is implemented using a gain-boosted folded-cascode amplifier. The gain-boosted folded-cascode amplifier can provide the necessary improved dc gain and Power Supply Rejection Ratio (PSRR).

For illustration, during measurement of macromolecules in a solution, since the macromolecules are usually charged, the voltage across the nanowire sensor connected into the loop 320 is restrained below about 0.5V. It will be appreciated by a person skilled in the art that the antibody receptors on the surface of nanowires and the macromolecules in a buffer solution to be detected are usually charged (ie. either positive or negative charge). Thus, in order to avoid electrochemical reactions, the potential applied across the nanowire sensor is limited to below 0.5V. That is, $V_{nw}=V_{refh}-V_{ref}=V_{ref}-V_{refl}$ is limited to below 0.5V. The baseline resistance of the nanowire typically varies between 10MΩ and 10 GΩ. Thus, if the voltage across the nanowire is set to about 0.4V, i.e., $V_{nw}=V_{refh}-V_{ref}=V_{ref}-V_{refl}=0.4$V, and the hysteresis band value $V_{TB}$ of the comparator 404 is designed to be about 80 mV, the system oscillation frequency can be limited to a range of about 25 kHz to about 2.5 kHz, assuming that the unit integration capacitor C0 is set to 100 fF (ie. compare Eq. (3)). $V_{refh}$ and $V_{refl}$ are provided off-chip. This would mean that capacitance values [100 fF, 1 pF, 10 pF] are available for microcontroller selection based on the detected nanowire sensor impedance.

Figure 5:
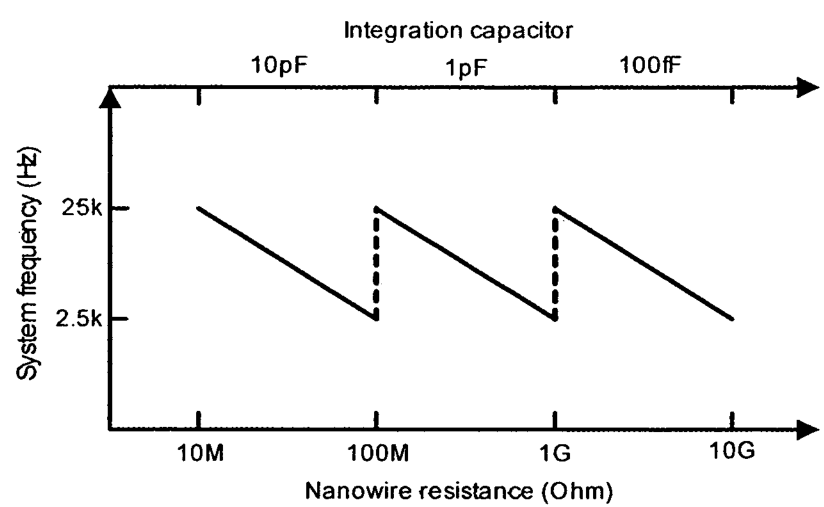
FIG. 5 is a frequency-resistance graph illustrating how system oscillation frequency is related to a combination of integration capacitance and nanowire sensor resistance.

FIG. 5 is a frequency-resistance graph 600 illustrating how the system oscillation frequency is related to a combination of integration capacitance and nanowire sensor resistance. The different integration capacitor values can cover three decades variation of nanowire sensor resistance.

Figure 6:
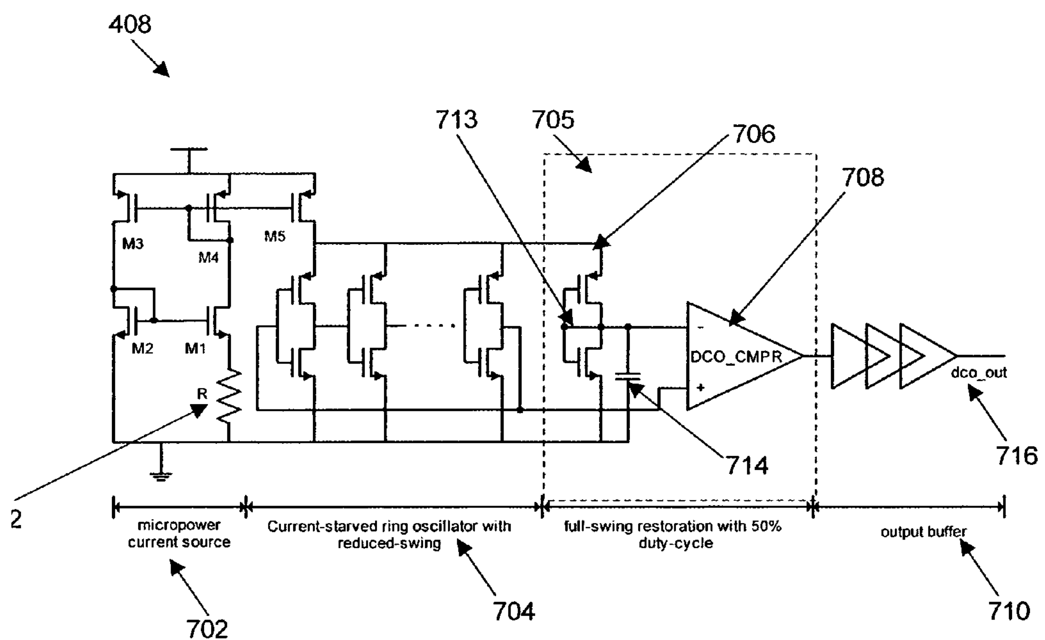
FIG. 6 is a schematic diagram illustrating a digitally-controlled ring oscillator (DCO) of the nanowire sensor system.

FIG. 6 is a schematic diagram illustrating the DCO 408 of the nanowire sensor system 300 (FIG. 3). The DCO 408 is of a current-starved type and has a duty-cycle of about 50%. The DCO 408 comprises a programmable $V_{th}$-referenced weak-inversion current source 702, a nine-stage current-starved ring oscillator 704 with reduced-swing output and a full swing restoration circuit 705 consisting of a dummy oscillator stage 706 coupled to a comparator stage 708 for restoration of full-swing output with a 50% duty-cycle. The DCO 408 further comprises a clock output buffer 710. Please refer to B. A. Warneke; "Ultra-low energy architectures and circuits for cubic milimeter distributed wireless sensor networks," *Ph.D. Dissertation*, Univ. of Cal. at Berkeley, 2003 for details on the current-starved ring oscillator 704 having the weak-inversion current source 702. The current consumed by the ring oscillator 704 is set by the $V_{th}$-referenced current source 702 using a programmable binary weighted resistor 712. In the $V_{th}$-referenced current source 702, a transistor M1 is sized as K times wider than a transistor M2 and the current flowing through the resistor 712 is $$I=\frac{V_{th}\ln K}{R}=\frac{kT\cdot\ln K}{q\cdot R}. \tag{4}$$

T is the temperature and q is the elementary charge constant. P-type metal-oxide-semiconductor (PMOS) transistors M3, M4 and M5 are sized at substantially the same dimensions for better current mirror matching. In contrast to M1/M2 that are operating in a weak-inversion region, the three PMOS current mirror transistors M3, M4 and M5 are working in a strong inversion region.

For a 1.8V supply, the current-starved DCO 408 swings only at about 0.6V. As will be appreciated by a person skilled in the art, this may not be acceptable by a typical/general logic inverter for level restoration. In one embodiment, the full swing restoration circuit 705 is added to further improve the circuit. The comparator stage 708 is implemented using a PMOS-input symmetrical opamp. The dummy oscillator stage 706 with its input and output connected together (see numeral 713) is used to obtain the dc voltage of the oscillator's output voltage swing. As will be appreciated by a person skilled in the art, the dummy oscillator stage 706 adds the oscillating signals at the input and output with a slight time delay to obtain the dc voltage of the oscillator's output voltage swing. The oscillator's output voltage swing is connected to a positive input of the opamp and the dc voltage of the oscillator's output voltage swing from the dummy oscillator stage 706 is connected to the negative input of the opamp. By comparing the output voltage swing to the dc voltage using the opamp, a full-swing output can be provided at the output of the opamp. As will be appreciated by a person skilled in the art, the full-swing output can have an amplitude close to the supply voltage applied to the opamp, ie. about 1.8V. A duty-cycle close to about 50% is also obtained by using the reference voltage with the time delay effects generated from the dummy oscillator stage 706. A 1 pF capacitor 714 is added at the output of the dummy oscillator stage 706 to reduce ripples on the output 716, ie. dco_out. The output buffer 710 is provided to enhance the driving capability of the DCO 408 since the DCO 408 is used to drive the flip-flop 406 (FIG. 4); an output pad for use for die bonding (not shown) and the external microcontroller 308 (FIG. 4). The output 716 is used for driving these components and for synchronisation.

Figure 7:
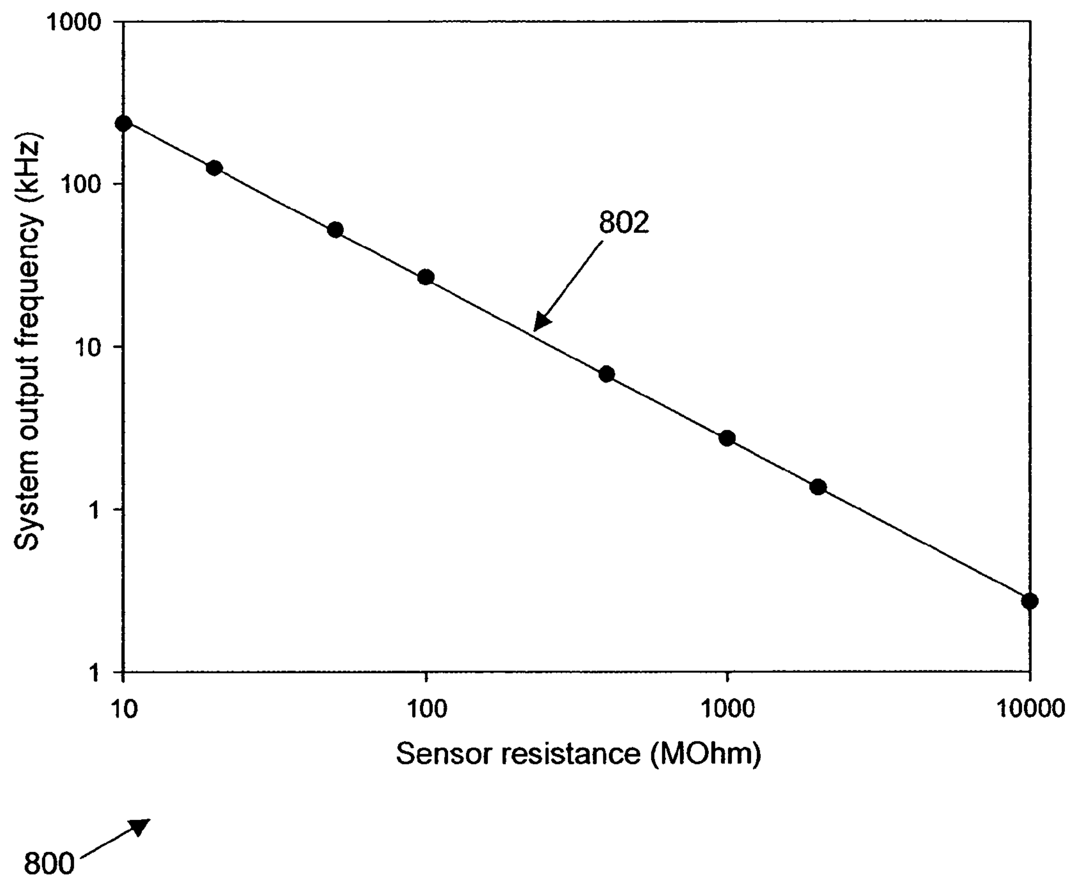
FIG. 7 is a graph of system output frequency vs sensor resistance obtained from simulation results using a sample interface circuit.

A sample interface circuit has been implemented in 0.18 μm CMOS technology. FIG. 7 is a graph 800 of system output frequency vs sensor resistance obtained from simulation results using the sample interface circuit. The $C_{int}$ of the sample interface circuit is fixed at 1 pF. The graph 800 shows a linear interface circuit response (compare numeral 802) over three decades of nanowire sensor resistance variations.

Figure 8:
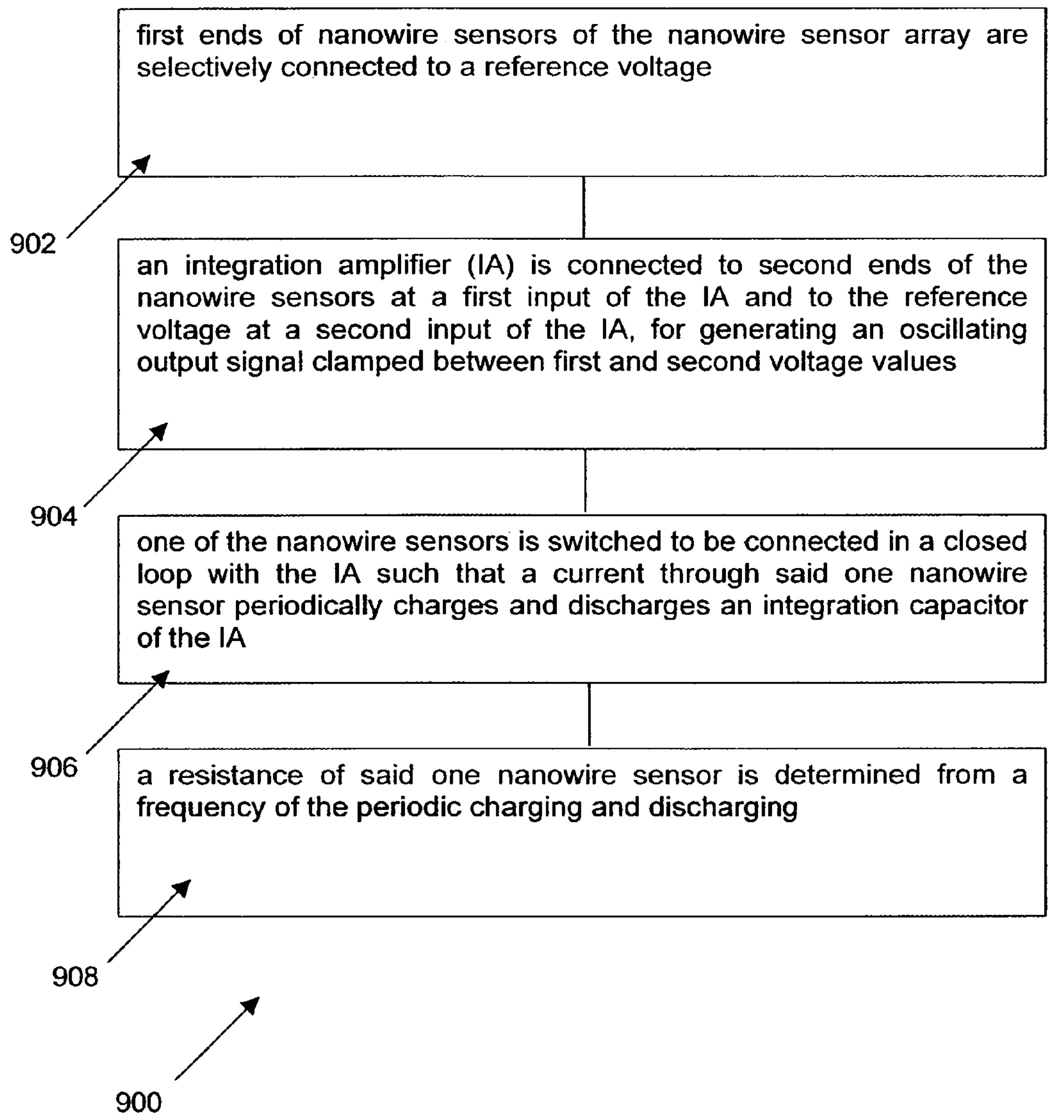
FIG. 8 is a schematic flowchart for illustrating a method for interrogating a nanowire sensor array.

FIG. 8 is a schematic flowchart 900 for illustrating a method for interrogating a nanowire sensor array. At step 902, first ends of nanowire sensors of the nanowire sensor array are selectively connected to a reference voltage. At step 904, an integration amplifier. (IA) is connected to second ends of the nanowire sensors at a first input of the IA and to the reference voltage at a second input of the IA, for generating an oscillating output signal clamped between first and second voltage values. At step 906, one of the nanowire sensors is switched to be connected in a closed loop with the IA such that a current through said one nanowire sensor periodically charges and discharges an integration capacitor of the IA. At step 908, a resistance of said one nanowire sensor is determined from a frequency of the periodic charging and discharging.

In the described example embodiment, there is provided an integrated nanowire sensor interface circuit that is configurable in terms of output frequency and can achieve a highly linear detection range over sensor resistance of 10MΩ to 10 GΩ, without using an additional calibration system. Furthermore, the typical problem arising from a large parasitic capacitance contributed by the common terminal of the nanowire sensor on sensing accuracy can be effectively avoided by the example embodiment.

The described example embodiment may be applied to bio-electronic applications. The described example embodiment can effectively implement a resistance-to-frequency conversion as an interface circuit for a nanowire sensor array. In the described example embodiment, a three-bit digitally-controlled current-starved ring oscillator is used to oversample the resistance-to-frequency conversion result for subsequent data processing. A duty-cycle of close to about 50% and a full-swing output may be obtained by using a reference voltage generated from a dummy oscillator stage in the described example embodiment.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. An interrogation circuit for a nanowire sensor array, the circuit comprising:

a switch array connected to the nanowire sensor array for selectively connecting first ends of nanowire sensors of the nanowire sensor array to a reference voltage; and an integration amplifier (IA) connected to second ends of the nanowire sensors at a first input of the IA and to the reference voltage at a second input of the IA, for generating an oscillating output signal clamped between first and second voltage values;

wherein the switch array is further arranged for switching one of the nanowire sensors to be connected in a closed loop with the IA such that a current through said one nanowire sensor periodically charges and discharges an integration capacitor of the IA for determining a resistance of said one nanowire sensor from a frequency of the periodic charging and discharging.

2. The circuit of claim 1, further comprising;

a comparator connected to an output of the IA at a first input of the comparator and to the reference voltage at a second input of the comparator, the comparator having an internal hysteresis for generating the oscillating output signal clamped between first and second voltage values at an output of the comparator; and a clocked flipflop connected to an output of the comparator at a first input of the flipflop and to a clock signal at a second input of the flipflop for measuring the frequency of the periodic charging and discharging.

3. The circuit of claim 2, further comprising a digitally-controlled ring oscillator (DCO) for generating the clock signal.

4. The circuit of claim 3, wherein the DCO comprises:

a programmable voltage-referenced inversion current source;

a multi-stage ring oscillator circuit having a reduced-swing output; and a full swing restoration circuit.

5. The circuit of claim 4, wherein the full swing restoration circuit comprises a dummy oscillator circuit and a comparator circuit, the full swing restoration circuit being capable of restoration of a full-swing output with a duty-cycle of about 50%.

6. The circuit of claim 2, wherein the switch array is arranged for switching said one of the nanowire sensors to be connected in a closed loop with the IA and the flipflop.

7. The circuit of claim 1, wherein the IA comprises an opamp connected to the second ends of the nanowire sensors at a first input of the opamp functioning as the first input of the IA, and to the reference voltage at a second input of the opamp functioning as the second input of the IA.

8. The circuit of claim 1, wherein the IA is programmable.

9. The circuit of claim 1, wherein the integration capacitor comprises a capacitor array for selectively setting a capacitance of the integration capacitor.

10. A method for interrogating a nanowire sensor array, the method comprising:

selectively connecting first ends of nanowire sensors of the nanowire sensor array to a reference voltage;

connecting an integration amplifier (IA) to second ends of the nanowire sensors at a first input of the IA and to the reference voltage at a second input of the IA, for generating an oscillating output signal clamped between first and second voltage values;

switching one of the nanowire sensors to be connected in a closed loop with the IA such that a current through said one nanowire sensor periodically charges and discharges an integration capacitor of the IA; and determining a resistance of said one nanowire sensor from a frequency of the periodic charging and discharging.

11. The method of claim 10, further comprising:

connecting a comparator to an output of the IA at a first input of the comparator and to the reference voltage at a second input of the comparator, the comparator having an internal hysteresis for generating the oscillating output signal clamped between first and second voltage values at an output of the comparator; and connecting a clocked flipflop to an output of the comparator at a first input of the flipflop and to a clock signal at a second input of the flipflop for measuring the frequency of the periodic charging and discharging.

12. The method of claim 11, further comprising generating the clock signal using a digitally-controlled ring oscillator (DCO).

13. The method of claim 12, wherein the DCO comprises:

a programmable voltage-referenced inversion current source;

a multi-stage ring oscillator circuit having a reduced-swing output; and a full swing restoration circuit.

14. The method of claim 13, wherein the full swing restoration circuit comprises a dummy oscillator circuit and a comparator circuit, the full swing restoration circuit being capable of restoration of a full-swing output with a duty-cycle of about 50%.

15. The method of claim 11, further comprising switching said one of the nanowire sensors to be connected in a closed loop with the IA and the flipflop.

16. The method of claim 10, wherein the IA comprises an opamp connected to the second ends of the nanowire sensors at a first input of the opamp functioning as the first input of the IA, and to the reference voltage at a second input of the opamp functioning as the second input of the IA.

17. The method of claim 10, wherein the IA is programmable.

18. The method of claim 10, wherein the integration capacitor comprises a capacitor array for selectively setting a capacitance of the integration capacitor.

* * * * *